(12) United States Patent
Ding

(10) Patent No.: US 6,754,340 B1
(45) Date of Patent: *Jun. 22, 2004

(54) STABLE ADAPTIVE FILTER AND METHOD

(75) Inventor: Heping Ding, Kanata (CA)

(73) Assignee: Nortel Networks Limited, Montreal (CA)

(*) Notice: Subject to any disclaimer, the term of this patent is extended or adjusted under 35 U.S.C. 154(b) by 0 days.

This patent is subject to a terminal disclaimer.

(21) Appl. No.: 09/218,428

(22) Filed: Dec. 22, 1998

(51) Int. Cl.$^7$ ................................................ H04M 9/08
(52) U.S. Cl. .............................. 379/406.08; 381/71.11; 708/322; 708/426; 370/465
(58) Field of Search ..................... 379/406.01, 406.08, 379/406.09, 142.01, 142.13; 381/71.1, 71.12, 71.14, 71.11; 708/322, 323, 426; 370/466, 467, 468

(56) References Cited

U.S. PATENT DOCUMENTS

| | | | |
|---|---|---|---|
| 5,428,562 A | 6/1995 | Gay ....................... | 364/724.19 |
| 5,568,411 A | 10/1996 | Batruni | |
| 5,677,951 A * | 10/1997 | Gay ....................... | 379/406.08 |
| 5,748,847 A * | 5/1998 | Lo .............................. | 706/14 |
| 5,901,059 A * | 5/1999 | Tao et al. ...................... | 700/29 |
| 5,995,620 A * | 11/1999 | Wigren .................. | 379/406.09 |
| 6,137,881 A * | 10/2000 | Oh et al. ............... | 379/406.08 |

FOREIGN PATENT DOCUMENTS

| | | |
|---|---|---|
| EP | 0 684 706 A | 11/1995 |
| EP | 0 751 619 A | 1/1997 |

OTHER PUBLICATIONS

K.M. Tao "Statistical Average and PARTAN–some alternatives to LMS and RLS," IEEE Int. Conf. Acoustics, Speech and Signa Processing, 1992, pp. IV-25–IV-28.*

Douglas S. C. ("Efficient Approximate Implementation of the Fast Affine Projection Algorithm using Orthogonal Transforms", Acoustics, Speech, and Signal Processing, 1996 Int. Conf.) vol. 3, pp. 1656–1659, May 7–10, 1996.*

Kazuhiko, O., et al, "An Adaptive Filtering Algorithm Using An Orthogonal Projection to an Affine Subspace and its Properties", Electronics and Communications in Japan, US, Scripta Technica, New York, vol. 67–A, No. 5, May 1/84, pp. 19–27.

"Analysis of the LNS Implementation of the Fast Affine Projection Algorithms", F. Albu et al., ISSC, Cork, Jun. 25–26, 2002.

"A Fast Affine Projection Algorithm for an Acoustic Echo Canceller Using a Fixed-Point DSP Processor", Stephen Oh et al., IEEE 1997, pp. 4121–4124.

"On the Use of A Modified Fast Affine Projection Algorithm in Subbands for Acoustic Echo Cancelation", Liu, Q.G., et al, Proc. 1996 IEEE Digital Signal Processing Workshop, Loen, Norway, Sep. 1–4, 1996, pp. 354–357.

"The Fast Affine Projection Algorithm", Gay S.L., et al, Proceedings of the International Conference on Acoustics, Speech and Signal Processing, Detroit, Michigan, USA, May 1995, pp. 3023–3026.

* cited by examiner

Primary Examiner—Minsun Oh Harvey
Assistant Examiner—Con P. Tran

(57) ABSTRACT

Stable adaptive filter and method are disclosed. The invention solves a problem of instability associated with Fast Affine Projection adaptive filters caused by error accumulation in an inversion process of an auto-correlation matrix. The Stable FAP uses a simplification of setting a normalized step size close to unity and reduces a problem of the matrix inversion to solving a system of linear equations whose solution coincides with a first column of the inverse auto-correlation matrix. The system of linear equations is then solved by one of descending iterative methods which provide inherent stability of operation due to intrinsic feedback adjustment. As a result, inevitable numerical errors are not accumulated, being corrected as the process goes on. In first and second embodiments of the invention the system of linear equation is solved by steepest descent and conjugate gradient methods respectively. Being immune to numerical errors, the invented method and filter are suitable for various DSP platforms, e.g., 16 and 24 bit fixed-point as well as floating point platform.

36 Claims, 4 Drawing Sheets

STABLE ADAPTIVE FILTER AND METHOD

FIELD OF THE INVENTION

The invention relates to adaptive filters, and in particular, to fast affine projection (FAP) adaptive filters providing a stability of operation, and methods of stable FAP adaptive filtering.

BACKGROUND OF THE INVENTION

Adaptive filtering is a digital signal processing technique that has been widely used in technical areas such as, e.g., echo cancellation, noise cancellation, channel equalization, system identification and in products like, e.g., network echo cancellers, acoustic echo cancellers for full-duplex hands-free telephones and audio conference systems, active noise control, data communications systems.

The characteristics of an adaptive filter are determined by its adaptation algorithm. The choice of the adaptation algorithm in a specific adaptive filtering system directly affects the performance of the system.

Being simple and easily stable, the normalized least mean square (NLMS) adaptation algorithm, being a practical implementation of the least mean square (LMS) algorithm, is now most widely used in the industry with a certain degree of success.

However, because of its intrinsic weakness, the NLMS algorithm converges slowly with colored training signals like the speech, an important class of signals most frequently encountered in many applications such as telecommunications. The performance of systems incorporating NLMS adaptive filters very often suffers from the slow convergence nature of the algorithm. Other known algorithms proposed so far are either too complicated to implement on a commercially available low-cost digital signal processor (DSP) or suffer from numerical problems. Recently, a fast affine projection (FAP) method was proposed as described in a publication by Steven L. Gay and Sanjeev Tavathia (Acoustic Research Department, AT&T Bell Laboratories), "The Fast Affine Projection Algorithm," pp. 3023–3026, Proceedings of the International Conference on Acoustics, Speech, and Signal Processing, May 1995, Detroit, Mich., U.S.A. The FAP is a simplified version of the more complicated, and therefore impractical, affine projection (AP) algorithm. With colored train signals such as the speech, the FAP usually converges several times faster than the NLMS, with only a marginal increase in implementation complexity.

However, a stability issue has been preventing FAP from being used in the industry. A prior art FAP implementation oscillates within a short period of time even with floating-point calculations. This results from the accumulation of finite precision numerical errors in a matrix inversion process associated with the FAP. Researchers have been trying to solve this problem, but no satisfactory answer has been found so far. A remedy proposed in the publication listed above and reinforced in publication by Q. G. Liu, B. Champagne, and K. C. Ho (Bell-Northern Research and INRS-Télécommunications, Université du Québec), "On the Use of a Modified Fast Affine Projection Algorithm in Subbands for Acoustic Echo Cancellation," pp. 354–357, Proceedings of 1996 IEEE Digital Signal Processing Workshop, Loen, Norway, September 1996, is to periodically re-start a new inversion process in parallel with the old one, and to use it to replace the latter so as to get rid of the accumulated numerical errors therein. While this can be a feasible solution for high-precision DSPs such as a floating-point processor, it is still not suitable for fixed-point DSP implementations because then the finite precision numerical errors would accumulate so fast that the re-starting period would have to be made impractically small, not to mention the extra complexity associated with this part of the algorithm.

Therefore there is a need in the industry for development of alternative adaptive filtering methods which would ensure stability of operation while providing fast convergence and reliable results.

SUMMARY OF THE INVENTION

It is an object of the present invention to provide an adaptive filter and a method of adaptive filtering which would avoid the afore-mentioned problems.

According to one aspect of the present invention there is provided a method of adaptive filtering, comprising the steps of:
(a) determining adaptive filter coefficients;
(b) updating the coefficients provided a normalized step size is close to unity, the updating step comprising:
determining an auto-correlation matrix coefficients from a reference input signal, the coefficients of the inverse of the auto-correlation matrix being projection coefficients;
determining projection coefficients by using a descending iterative method having an inherent stability of operation, the projection coefficients being used for updating the filter coefficients;
(c) repeating the step (b) required number of times.

Advantageously, determining of the auto-correlation matrix is performed recursively. The normalized step size is chosen to be less than unity. Preferably, it equals unity. Conveniently, the normalized step size is within a range from about 0.9 to 1.0. In some applications, it may be chosen from a range from about 0.7 to 1.0.

In the embodiments of the invention a problem of finding the inverse of an auto-correlation matrix is reduced to a problem of solving a system of linear equations based on the auto-correlation matrix. The system is solved by one of descending iterative methods which provide inherent stability of operation due to an intrinsic feedback adjustment. As a result inevitable numerical errors are not accumulated. First and second embodiments use steepest descent and conjugate gradient methods respectively. Alternatively, other known descending methods, e.g. Newton's method, PARTAN or quasi-Newton's method may also be used.

The method is suitable for a variety of applications, e.g. echo cancellation, noise cancellation, channel equalization, system identification which are widely used in products such as network echo cancellers, acoustic echo cancellers for full-duplex handsfree telephones and audio conference systems, active noise control systems, data communication systems.

According to another aspect of the invention there is provided an adaptive filter, comprising:
a filter characterized by adaptive filter coefficients;
a means for updating the coefficients, the means being set with a normalized step size close to its maximal value and comprising:
a correlator for determining an auto-correlation matrix coefficients from a reference input signal, the coefficients of the inverse of the auto-correlation matrix being projection coefficients;

a calculator for determining projection coefficients by using a descending iterative method having an inherent stability of operation, the projection coefficients being used for updating the filter coefficients.

Advantageously, the calculator is a recursive calculator. Preferably, the calculator is a steepest descent or a conjugate gradient calculator. Alternatively, it may be a calculator performing a Newton's or quasi-Newton's method, a PARTAN calculator, or another known iterative descending calculator providing an inherent stability of operation.

Conveniently, the filter and the updating means are capable of operating with real numbers. Alternatively, they may be capable of operating with complex numbers.

The adaptive filter as described above may be used for echo cancellation, noise cancellation, channel equalization, system identification or other applications where adaptive filtering is required.

According to another aspect of the invention there is provided a method of adaptive filtering, comprising the steps of:

(a) determining adaptive filter coefficients;

(b) updating the coefficients provided a normalized step size is close to unity, the updating step comprising:
  recursively determining an auto-correlation matrix coefficients from a reference input signal, coefficients in the first column of the inverse of the auto-correlation matrix being projection coefficients;
  determining the projection coefficients from a system of linear equations whose solution coincides with the projection coefficients, the system being based on the auto-correlation matrix and solved by a descending iterative method having an inherent stability of operation, the projection coefficients being used for updating the filter coefficients;

(c) repeating the step (b) the requires number of times.

According to yet another aspect of the invention there is provided an adaptive filter, comprising:

a filter characterized by adaptive filter coefficients;

a means for updating the coefficients, the means being set with a normalized step size close to unity and comprising:
  a correlator for recursively determining an auto-correlation matrix coefficients from a reference input signal, the first column of the inverse of the auto-correlation matrix forming projection coefficients;
  a calculator for determining the projection coefficients from a system of linear equations whose solution coincides with the projection coefficients, the system being based on the auto-correlation matrix and solved by a descending iterative method having an inherent stability of operation, the projection coefficients being used for updating the adaptive filter coefficients.

The adaptive filter and method described above have an advantage over known FAP adaptive filters by providing a stability of operation. The problem caused by error accumulation in matrix inversion process existing in known FAP filters is solved in the present invention by using iterative descending methods. First, the matrix inversion operation is reduced to a solution of a corresponding system of linear equations based on the auto-correlation matrix. Second, the iterative descending methods, used for the solution of the above system, provide an inherent stability of operation due to an intrinsic feedback adjustment. As a result, inevitable numerical errors are not accumulated, thus providing stability of adaptive filtering.

BRIEF DESCRIPTION OF THE DRAWINGS

The invention will now be described in greater detail regarding the attached drawings in which.

DETAILED DESCRIPTION OF THE PREFERRED EMBODIMENTS

A. INTRODUCTION

Figure 1:
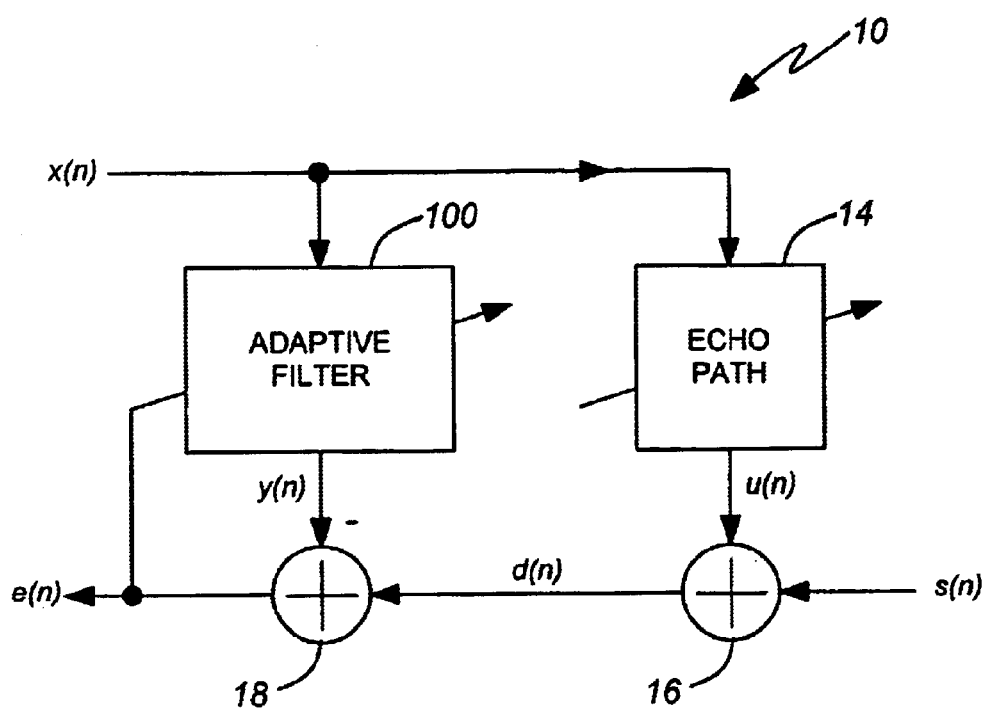
FIG. 1 is a block diagram of an adaptive echo cancellation system.

FIG. 1 presents a block diagram of an adaptive echo cancellation system 10 with an embedded adaptive filter 100, the echo cancellation being chosen as an exemplary representation of a wide class of adaptive filtering applications. A digitally sampled far-end reference input signal x(n) is supplied to the adaptive filter 100 and to an echo path 14 producing an unwanted signal u(n), the signal being an echo of x(n) through the echo path 14. The echo path 14 can be either a long electrical path, e.g. in a telecommunication network, or an acoustical path, e.g. in a room. An echo canceller may be used together with a telecommunication network switch or a speaker phone. The unwanted signal u(n) is mixed up with the wanted near-end signal e(n) in a summer 16 to produce a response signal d(n). The response signal d(n) is sent to another summer 18 together with an echo estimate signal y(n) generated by the adaptive filter 100. The summer 18 subtracts y(n) from d(n) producing an output signal e(n), to be transmitted to the far-end. Since the echo path is constantly changing, the adaptive filter must be able to continuously adapt to the new echo path. Therefore the goal is to produce the echo estimate signal y(n) as close to u(n) as possible, so that the latter is largely cancelled by the former, and e(n) best resembles e(n). The output signal e(n), sometimes called the error signal, is then transmitted to the far-end and also sent to the adaptive filter 100 which uses it to adjust its coefficients.

Note that, depending on a particular application, the terms "far-end" and "near-end" may need to be interchanged. For example, with a network echo canceller in a telephone terminal, x(n) in FIG. 1 is actually the near-end signal to be transmitted to the far-end, and d(n) in FIG. 1 is the signal received from the telephone loop connected to the far-end. Although the terminology used above is based on the assumption that x(n) is the far-end signal and d(n) is the signal perceived at the near-end, it is done solely for convenience and does not prevent the invention from being applied to other adaptive filter applications with alternate terminology.

The following conventions in linear algebra representation are used throughout the text of the present patent. Underscored letters, such as $\underline{d}(n)$ and $\underline{X}(n)$, stand for column vectors, and bold-faced ones, like $\mathbf{X}(n)$, are matrices. $\underline{d}(n)$ stands for an N−1 vector consisting of the N−1 upper most elements of the N vector $\underline{d}(n)$, and $\underline{\bar{d}}(n)$ stands for an N−1 vector consisting of the N−1 lower most elements of the N vector $\underline{d}(n)$. A superscript T stands for the transposition of a matrix or vector.

1. The Normalized Least Mean Square (NLMS) Filter

The following L-dimensional column vectors are defined $$\underline{X}(n) \equiv \begin{bmatrix} x(n) \\ x(n-1) \\ \ldots \\ x(n-L+1) \end{bmatrix} \text{ and } \underline{W}(n) \equiv \begin{bmatrix} w_0(n) \\ w_1(n) \\ \ldots \\ w_{L-1}(n) \end{bmatrix} \quad \text{(Equation 1)}$$

as the reference input vector and the adaptive filter coefficient vector respectively, where L is the length of the adaptive filter.

The part for convolution and subtraction, which derives the output of the adaptive echo cancellation system, can then be expressed as $$e(n) = \quad \text{(Equation 2)}$$

$$d(n) - y(n) = d(n) - \sum_{l=0}^{L-1} w_l(n)x(n-1) = d(n) - \underline{X}^T(n)\underline{W}(n)$$

where the superscript T stands for transpose of a vector or matrix. The adaptation part of the method, which updates the coefficient vectors based on the knowledge of the system behavior, is $$\underline{W}(n+1) = \underline{W}(n) + 2\mu(n)e(n)\underline{X}(n) \quad \text{(Equation 3)}$$

$$\mu(n) = \frac{\alpha}{\underline{X}^T(n)\underline{X}(n) + \delta}$$

In Equation 3, $\mu(n)$ is called the adaptation step size, which controls the rate of change to the coefficients, $\alpha$ is a normalized step size, and $\delta$, being a small positive number, prevents $\mu(n)$ from going too big when there is no or little reference signal x(n).

The computations required in the NLMS filter include 2L+2 multiply and accumulate (MAC) operations and 1 division per sampling interval. Details about the least mean square (LMS) method can be found, e.g. in classical papers to B. Widrow, et al., "Adaptive Noise Cancelling: Principles and Applications," Proceedings of the IEEE, Vol. 63, pp. 1692–1716, December 1975 and B. Widrow, et al., "Stationary and Nonstationary Learning Characteristics of the LMS Adaptive Filter," Proceedings of the IEEE, Vol. 64, pp. 1151–1162, August 1976.

2. The Affine Projection (AP) Filter

The affine projection method is a generalization of the NLMS method. With N being a so-called projection order, we define $$\underline{d}(n) \equiv \begin{bmatrix} d(n) \\ d(n-1) \\ \ldots \\ d(n-N+1) \end{bmatrix}, \underline{e}(n) \equiv \begin{bmatrix} e(n) \\ e(n-1) \\ \ldots \\ e(n-N+1) \end{bmatrix}_{\underline{W}(n)} \quad \text{(Equation 4)}$$

$$X(n) = \begin{bmatrix} x(n) & x(n-1) & \ldots & x(n-N+1) \\ x(n-1) & x(n-2) & \ldots & x(n-N) \\ \ldots & \ldots & \ldots & \ldots \\ x(n-L+1) & x(n-L) & \ldots & x(n-N-L+2) \end{bmatrix}$$

where $\underline{d}(n)$ and $\underline{e}(n)$ are N vectors and X(n) is an L×N matrix. Usually N is much less than L so that X(n) is like a "portrait", rather than a "landscape", matrix. Note that $\underline{e}(n)$ in (Equation 4) is the a priori error vector; all its elements, including e(n−1), . . . e(n−N+1), depend on $\underline{W}(n)$, as indicated in (Equation 5) below.

The convolution and subtraction part of the method is $$\underline{e}(n) = \underline{d}(n) - X^T(n)\underline{W}(n) \quad \text{(Equation 5)}$$

where W(n) is defined in Eq. 1. The updating part of the method includes the following steps $$\underline{W}(n+1) = \underline{W}(n) + \alpha X(n)\underline{\varepsilon}(n) \quad \text{(Equation 6)}$$

$$\underline{\varepsilon}(n) = P(n)\underline{e}(n)$$

$$P(n) = R^{-1}(n)$$

$$R(n) \equiv X^T(n)X(n) + \delta I$$

where I is the N×N identity matrix, and $\alpha$ and $\delta$ play similar roles as described with regards to Equation 3. $\alpha$ is the normalized step size which may have a value from 0 to 1, and very often is assigned a unity value. $\delta$ is a regularization factor that prevents R(n), the auto-correlation matrix, from becoming ill-conditioned or rank-deficient, in which case P(n) would have too big eigenvalues causing instability of the method. It can be seen that an N×N matrix inversion operation at each sampling interval is needed in the AP method.

The AP method offers a good convergence property, but computationally is very extensive. It needs $2LN+O(N^2)$ MACs at each sampling interval. For example, for N equal 5, which is a reasonable choice for many practical applications, the AP is more than 5 times as complex as the NLMS.

3. The Fast Affine Projection (FAP) Filter

Since the AP method is impractically expensive computationally, certain simplifications have been made to arrive at the so-called FAP method, see, e.g. U.S. Pat. No. 5,428,562 to Gay. Note that here the "F", for "fast", means that it saves computations, not faster convergence. In fact by adopting these simplifications, the performance indices, including the convergence speed, will slightly degrade.

Briefly, the FAP method consists of two parts:

(a) An approximation which is shown in equation 7 below and certain simplifications to reduce the computational load. The approximation in Equation 7 uses the a posteriori errors to replace the a priori ones in Equation 4;

$$\underline{e}(n) \approx \begin{bmatrix} e(n) \\ (1-\alpha)\underline{\bar{e}}(n-1) \end{bmatrix} = \begin{bmatrix} e(n) \\ (1-\alpha)e(n-1) \\ (1-\alpha)^2 e(n-2) \\ \ldots \\ (1-\alpha)^{N-1}e(n-N+1) \end{bmatrix} \quad \text{(Equation 7)}$$

(b) The matrix inversion operation.

The matrix inversion may be performed by using different approaches. One of them is a so-called "sliding windowed fast recursive least square (FRLS)" approach, outlined in U.S. Pat. No. 5,428,562 to Gay, to recursively calculate the P(n) in Eq. 6. This results in a total requirement of computations to be 2L+14N MACs and 5 divisions. In another approach, the matrix inversion lemma is used twice to derive P(n) at sampling interval n, see, e.g. Q. G. Liu, B. Champagne, and K. C. Ho (Bell-Northern Research and INRS-Télécommunications, Université du Québec), "On the Use of a Modified Fast Affine Projection Algorithm in Subbands for Acoustic Echo Cancellation," pp. 354–357, Proceedings of 1996 IEEE Digital Signal Processing Workshop, Loen, Norway, September 1996. It assumes an accurate estimate P(n−1) to start with, then derives P(n) by modifying P(n−1) based on P(n−1) and knowledge of the new data X(n). The total computations needed for such a FAP system are $2L+3N^2+12N$ MACs and 2 divisions. Compared with the "sliding windowed" approach, this method offers a more accurate estimation for P(n) because a conventional recursive least square (RLS) algorithm is used, instead of a fast version of it which has inevitable degradations.

Note that, it always arrives at the most accurate and stable solution to solve the matrix inversion problem directly by using classical methods. However, these methods are too expensive computationally to implement on a real time platform. Therefore, various alternative approaches with much less complexity, such as the ones described above, are used. The above matrix inversion methods have no feedback adjustment. An accurate estimate of P(n) relies heavily on an accurate starting point P(n−1). If P(n−1) deviates from the accurate solution, the algorithm has no way of knowing that, and will still keep updating it based on it and the new X(n). This means that errors in P(n−1), if any, will very likely accumulate and be passed on to P(n), P(n+1), P(n+2), and so on, and therefore stay in the system forever. When P(n) deviates from the accurate value, so will the calculated $\underline{\epsilon}(n)$, as shown in Eq. 6. As a result, the first expression in Eq. 6 shows that the coefficient vector W(n) will no longer be updated properly. That is, W(n) can be updated in wrong directions, causing the adaptive filtering system to fail. A proposed remedy is to periodically re-start a new inversion process, either sliding windowed FRLS or conventional RLS based, in parallel with the old one, and to replace the old one so as to get rid of the accumulated numerical errors in the latter. While this can be a feasible solution for high-precision DSPs such as a floating-point processor, it is still not suitable for fixed-point DSP implementations because then the finite precision numerical errors would accumulate so fast that the re-starting period would have to be made impractically short.

4. Stable Fast Affine Projection Filter

Usually, for maximum convergence speed, the normalized step size α, as indicated in Eq. 6, is set to a value of unity, or less than but quite close to it. This is the case described in the publications and the U.S. Pat. No. 5,428,562 cited above. It indicates that in this case $\underline{e}(n)$ will have only one significant element, e(n) as the very first one. Thus, the calculation for $\underline{e}(n)$ (Eq. 6) reduces from the product between a matrix and a vector to that between a vector and a scalar, i.e.

$$\underline{\epsilon}(n)=e(n)\underline{P}(n) \qquad \text{(Equation 8)}$$

where P(n) is the very first, i.e., left most, column of the matrix P(n). Typically, α is greater than 0.9 and less or equal to 1.0. It is also indicated in the publication to Q. G. Liu cited above that, even with an α slightly less than that range, say 0.7, the approximation is still acceptable. Thus, one only needs to calculate N, rather than all the $N^2$, elements of P(n).

In light of the above, the problem of finding P(n), the inverse of the auto-correlation matrix $$R(n)\equiv X^T(n)X(n)+\delta I \qquad \text{(Equation 9)}$$

reduces to solving a set of N linear equations $$R(n)\underline{P}(n) = \underline{b}, \; \underline{b} \equiv \begin{bmatrix} 1 \\ \underline{0} \end{bmatrix} \qquad \text{(Equation 10)}$$

where R(n) is symmetric and positive definite according to its definition Eq. 9, and b is an N vector with all its elements zero except the very first, which is unity.

Although Eq. 10 is much simpler to be solved than the original matrix inversion problem, it is still quite expensive, and especially division extensive, to do that with classical methods like Gaussian elimination. Therefore the obtained system of linear equations is solved by one of iterative descending methods which provide an inherent stability of operation and avoid accumulation of numerical errors as will be described in detail below.

B. DETAILED DESCRIPTION OF THE PREFERRED EMBODIMENTS

A method of adaptive filtering implemented in an adaptive filter according to the first embodiment of the invention includes an iterative "steepest descent" technique to iteratively solve the Equation 10.

In general, steepest descent is a technique that seeks the minimum point of a certain quadratic function iteratively. At each iteration (the same as sampling interval in our application), it takes three steps consecutively:

1. to find the direction in which the parameter vector should go. This is just the negative gradient of the quadratic function at the current point;
2. to find the optimum step size for the parameter vector updating so that it will land at the minimum point along the direction dictated by the above step; and
3. to update the parameter vector as determined above.

By iteratively doing the above, the steepest descent reaches the unique minimum of the quadratic function, where the gradient is zero, and continuously tracks the minimum if it moves. Details about the steepest descent method can be found, for example, in a book by David G. Luenberger (Stanford University), Linear and Nonlinear Programming, Addison-Wesley Publishing Company, 1984.

For an adaptive filtering application, the implied quadratic function is as follows $$\frac{1}{2}\underline{P}^T(n)R(n)\underline{P}(n) - \underline{P}^T \underline{b} \qquad \text{(Equation 11)}$$

whose gradient with respect to P(n) can be easily found as $$\underline{g}=R(n)\underline{P}(n)-\underline{b} \qquad \text{(Equation 12)}$$

where b is defined in (Equation 10). Note that R(n) must be symmetric and positive definite in order for the steepest descent technique to be applicable, this happens to be our case. Seeking the minimum, where the gradient vanishes, is equivalent to solving (Equation 10). The steepest descent is also able to track the minimum point if it moves, such as the case with a non-stationary input signal X(n).

Based on the above discussion, the stable FAP (SFAP) method which uses the steepest descent technique includes the following steps: Initialization;

$$\underline{W}(0) = \underline{0}, \ \underline{X}(0) = \underline{0}, \ \underline{\eta}(0) = \underline{0}, \quad \text{(Equation 13)}$$

$$R(0) = \delta I, \ \alpha = 1, \ \underline{P}(0) = \begin{bmatrix} 1/\delta \\ \underline{0} \end{bmatrix}$$

Updating the adaptive filter coefficients in sampling interval n including:
recursive determining of an auto-correlation matrix:

$$R(n) = R(n-1) + \underline{\xi}(n)\underline{\xi}^T(n) - \underline{\xi}(n-L)\underline{\xi}^T(n-L) \quad \text{(Equation 14)}$$

determining projection coefficients by solving the system of linear equations 10 using the steepest descent technique, the projection coefficients being the coefficients of the inverse of the auto-correlation matrix:

$$\underline{g}(n) = R(n)\underline{P}(n-1) - \begin{bmatrix} 1 \\ \underline{0} \end{bmatrix} \quad \text{(Equation 15)}$$

$$\beta(n) = \frac{\underline{g}^T(n)\underline{g}(n)}{\underline{g}^T(n)R(n)\underline{g}(n)} \quad \text{(Equation 16)}$$

$$\underline{P}(n) = \underline{P}(n-1) - \beta(n)\underline{g}(n) \quad \text{(Equation 17)}$$

and performing an adaptive filtering for updating the filter coefficients $$\underline{W}(n) = \underline{W}(n-1) + \alpha \eta_{N-1}(n-1)\underline{X}(n-N) \quad \text{(Equation 18)}$$

$$y(n) = \underline{W}^T(n)\underline{X}(n) + \alpha \underline{\eta}^{-T}(n-1)\underline{\tilde{R}}(n) \quad \text{(Equation 19)}$$

$$e(n) = d(n) - y(n) \quad \text{(Equation 20)}$$

$$\underline{\varepsilon}(n) = e(n)\underline{P}(n) \quad \text{(Equation 21)}$$

$$\underline{\eta}(n) = \begin{bmatrix} 0 \\ \underline{\tilde{\eta}}(n-1) \end{bmatrix} + \underline{\varepsilon}(n) \quad \text{(Equation 22)}$$

where $\underline{\xi}(n)$ is $$\underline{\xi}(n) \equiv \begin{bmatrix} x(n) \\ x(n-1) \\ \ldots \\ x(n-N+1) \end{bmatrix} \quad \text{(Equation 23)}$$

$\underline{R}(n)$ is the first column of $R(n)$, $\underline{\tilde{R}}(n)$ is an N−1 vector that consists of the N−1 lower most elements of the N vector $\underline{R}(n)$, and $\underline{\tilde{\eta}}(n)$ is an N−1 vector that consists of the N−1 upper most elements of the N vector $\underline{\eta}(n)$.

It is important to note that feedback adjustment provided by Equations 15, 16 and 17 does not exist in known prior art approaches. The prior art FAP approaches determine P(n) based on P(n−1) and the new incoming data X(n) only, without examining how well a P actually approximates $R^{-1}(n)$. Therefore inevitable numerical errors will accumulate and eventually make the system collapse. The feedback provided by a stable descending method, used in our invention, uses Equation 15 to examine how well P(n−1), or the needed part of it, approximates $R^{-1}(n)$, or its corresponding part. Then the adjustments are performed in Equations 16 and 17 accordingly to derive P(n), or the needed part of it. As just mentioned, this examination is done by evaluating g(n) in Eq. 15 as the feedback error.

The three expressions shown in Equations 15, 16 and 17 correspond to the three steps of the steepest descent technique discussed above. g(n) is the gradient of the implied quadratic function (Eq. 15), β(n) is the optimum step size for parameter vector adjustment, which is made in Eq. 17. As follows from Table 1, the total computational requirement of the Stable FAP method according to the first embodiment of the invention is $2L+2N^2+7N-1$ MACs and 1 division. Note, that for the steepest descent technique to work adequately for the purpose of adaptive filtering, the projection order N has to be chosen to assure that the steepest descent converges faster than the adaptive filter coefficients do. The required pre-determined value of N will depend on a particular adaptive filtering application.

TABLE 1

| Equation | Multiply and accumulate operations | Division |
| --- | --- | --- |
| 14 | 2N | |
| 15 | N | |
| 16 | $N^2$ | 1 |
| 17 | N | |
| 18 | L | |
| 19 | L + N − 1 | |
| 20 | | |
| 21 | N | |
| 22 | | |
| Total | $2L + 2N^2 + 7N - 1$ | 1 |

An adaptive filter 100 according to the first embodiment of the invention and operating in accordance with the method described above is shown in FIG. 2. It includes a filter 102 characterized by adaptive filter coefficients W(n), and means 104 for updating the coefficient the means being set with a normalized step size α close to its maximal value, i.e. unity. The filter 102 is a finite impulse response (FIR) filter which receives a reference input signal x(n) and an auxiliary signal f(n), used for updating the coefficients, and generates a provisional echo estimate signal PR(n). The updating means 104 includes a correlator 106 for recursively generating an auto-correlation signal presented in the form of auto-correlation matrix coefficients R(n) based on the reference input signal x(n), and a calculator 108 for generating projection coefficients $\underline{P}(n)$, the projection coefficients being part of the coefficients of the inverse of the auto-correlation matrix. The calculator 108 defines projection coefficients by using an iterative steepest descent method having an inherent stability of operation as illustrated in detail above. The projection coefficients are used within updating means 104 for generation the auxiliary filter adaptation signal f(n) and an echo estimate correction signal EC(n). The latter is used together with the provisional echo estimate PR(n) to produce the echo estimate signal y(n).

Figure 2:
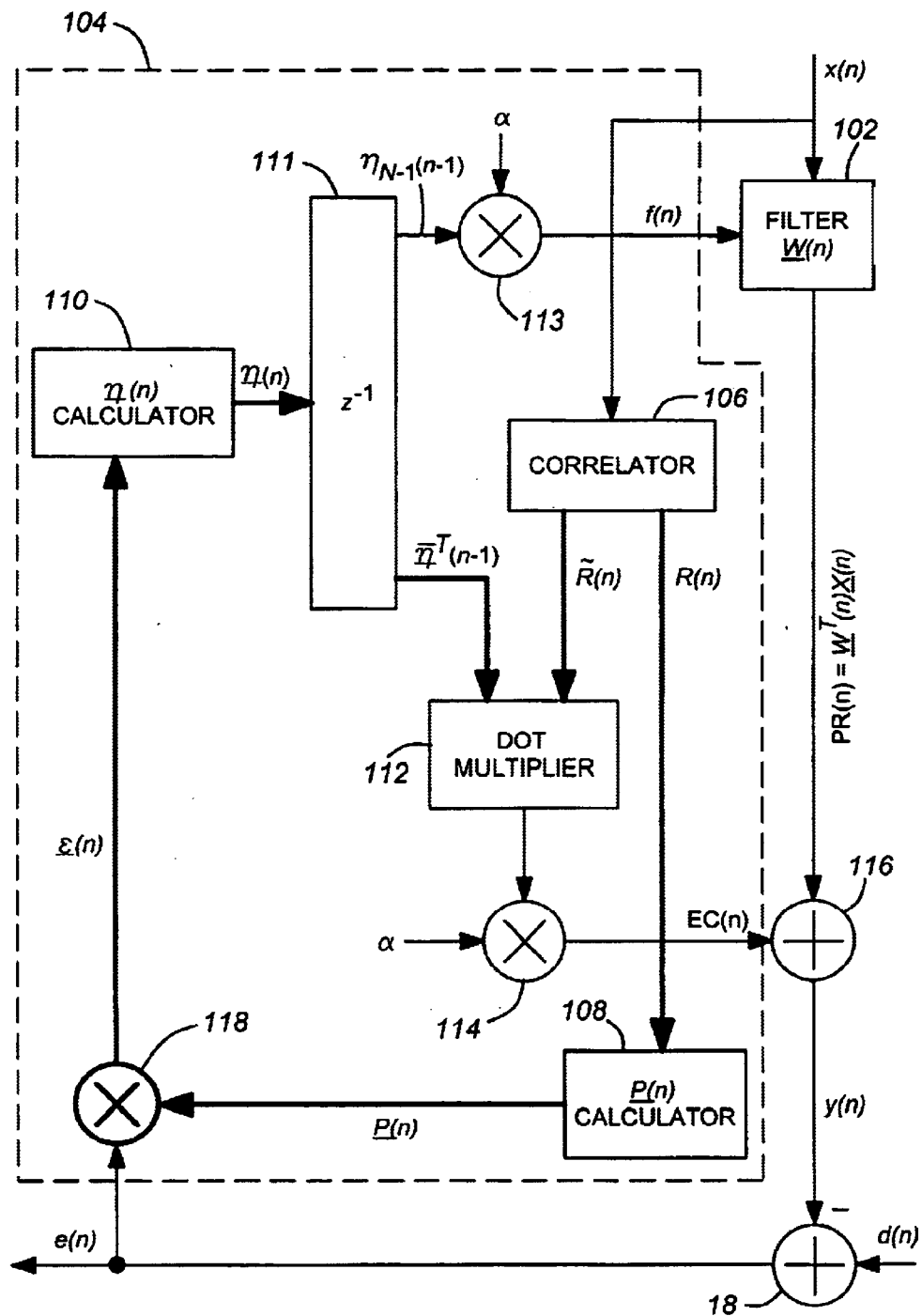
FIG. 2 is a block diagram of an adaptive filter according to the first embodiment of the invention.

A convention in FIG. 2 is the use of a thick line to represent the propagation of a matrix or vector signal, i.e., with more than one component, and the use of a thin line to stand for a scalar signal propagation. In FIG. 2 a correlator 106 determines the autocorrelation matrix R(n) in accordance with the Eq. 14 using the current and past x(n) samples. An "$\underline{\eta}(n)$ calculator" 110 calculates $\underline{\eta}(n)$ based on Eq. 22, and as shown in FIG. 2, $\underline{\eta}(n)$ is not used by the updating means 104 until the next sampling interval. The filter 102 produces the convolutional sum $\underline{W}^T(n)\underline{X}(n)$. $\eta_{N-1}$ (n−1) is obtained from $\eta_{N-1}(n)$ by putting the latter through a unit delay element 111, providing a delay of one sampling interval, and further multiplied by the step size α in a Multiplier 113. The result is used for updating the adaptive filter coefficients in (Eq. 18). $\overline{\eta}^T(n-1)$ is dot-multiplied with part of R(n) by a Dot multiplier 112, and the result is further multiplied by a multiplier 114 with the step size α to form the correction term to be added to $\underline{W}^T(n)\underline{X}(n)$ by the summer 116 to form the filter output y(n) (Eq. 19). The summer 18 calculates the error, or the output, e(n), as in (Eq. 20). The scalar-vector multiplier 118 derives $\underline{\epsilon}(n)$ in accordance with Equation 21.

Figure 3:
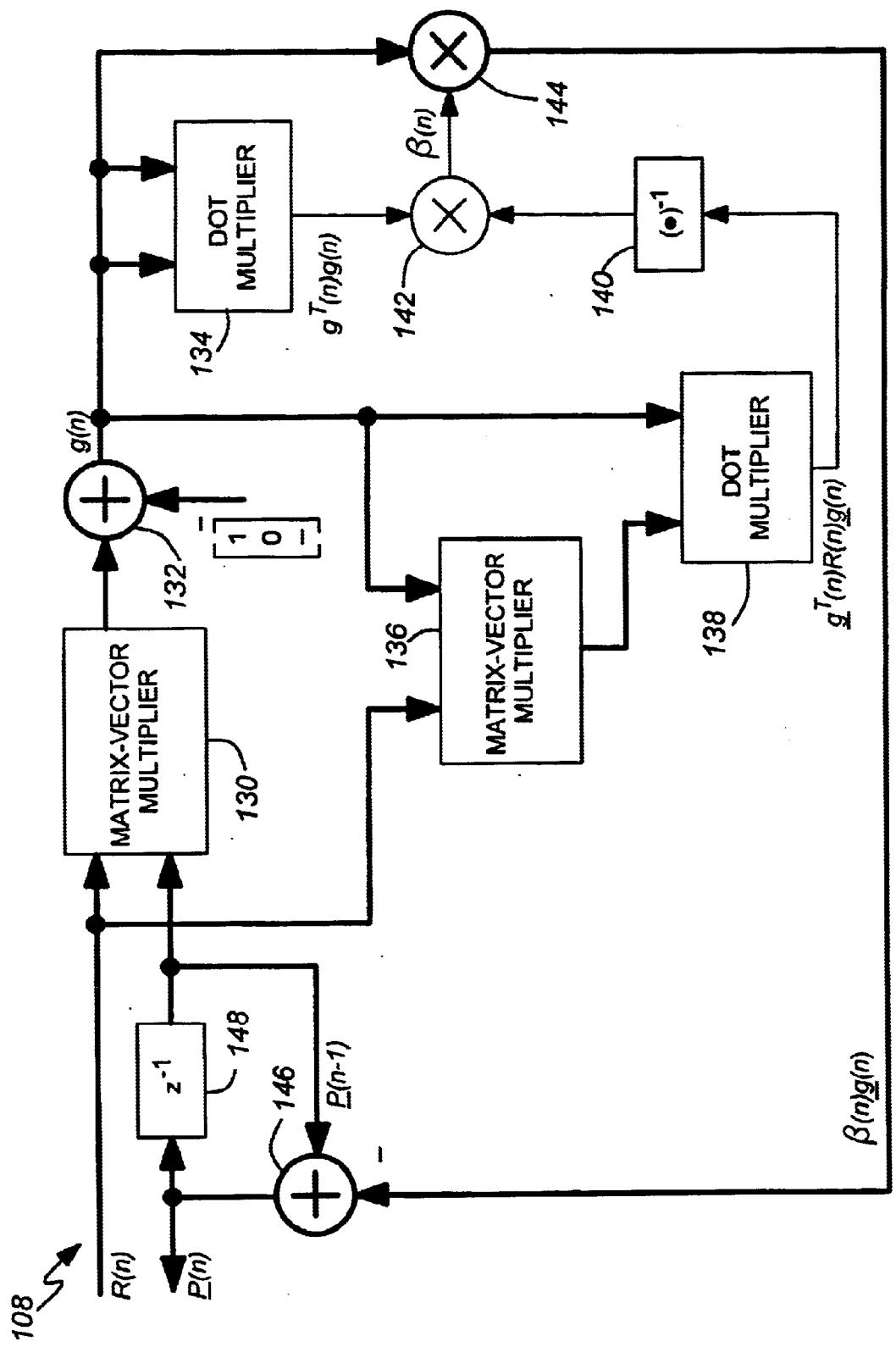
FIG. 3 is a block diagram of a steepest descent calculator embedded in the filter of FIG. 2.

A steepest descent calculator 108 is shown in detail in FIG. 3. Thick lines represent the propagation of a matrix or vector signal, i.e., with more than one component, and the use of a thin line stands for a scalar signal propagation. In the calculator 108, the auto-correlation matrix R(n) and the vector P(n−1) which is a part of the estimated inverse of R(n−1), are multiplied in a Matrix-vector multiplier 130. The vector product is further subtracted by a constant vector $[1\ 0\ \ldots\ 0]^T$ in a Summer 132 to produce the gradient vector $\underline{g}(n)$, which contains the feedback error information about using $\underline{P}(n-1)$ as the estimated inverse of R(n). This part corresponds to Eq. 15. The squared norm of $\underline{g}(n)$ is then found by dot-multiplying $\underline{g}(n)$ with itself in a Dot multiplier 134. It is used as the numerator in calculating β(n) in Eq. 16. A Matrix-vector multiplier 136 finds the vector product between the autocorrelation matrix R(n) and the gradient vector $\underline{g}(n)$. This vector product is then dot-multiplied with $\underline{g}(n)$ in another Dot multiplier 138 to produce the denominator in calculating β(n) in Eq. 16. This denominator is reciprocated in a Reciprocator 140, and then further scalar-multiplied with the aforementioned numerator in scalar multiplier 142 to produce β(n). This is the only place where any division operation is performed. Finally, β(n) is multiplied with the gradient $\underline{g}(n)$ in a scalar-vector multiplier 144 to form the correction term to $\underline{P}(n-1)$. This correction term is then subtracted from $\underline{P}(n-1)$ in a Vector Summer 146 to derive $\underline{P}(n)$ in accordance with Eq. 17. $\underline{P}(n-1)$ is obtained from $\underline{P}(n)$ by using a unit delay element 148, providing a delay of one sampling interval.

Two C language prototypes implementing the steepest descent technique have been built. The first one is a floating point module, and the second one is a 16-bit fixed-point DSP implementation. A floating-point module simulating the NLMS acoustic echo canceller design in Venture, a successful full-duplex handsfree telephone terminal product by Northern Telecom Ltd., and a bench mark, floating-point module that repeats a prior art FAP scheme by Q. G. Liu, B. Champagne, and K. C. Ho (Bell-Northern Research and INRS-Télécommunications, Université du Québec), "On the Use of a Modified Fast Affine Projection Algorithm in Subbands for Acoustic Echo Cancellation," pp. 354–357, Proceedings of 1996 IEEE Digital Signal Processing Workshop, Loen, Norway, September 1996, have been also implemented for comparison purposes. The following data files have been prepared for processing. The source ones are speech files with Harvard sentences (Intermediate Reference System filtered or not) sampled at 8 KHz and a white noise file. Out of the source files certain echo files have been produced by filtering the source ones with certain measured, 1200-tap, room impulse responses. These two sets of files act as x(n) and d(n) respectively. The major simulation results are as follows. The bench mark prior art floating-point FAP scheme with L=1024 and N=5, goes unstable at 2'57" (2 minutes and 57 seconds, real time, with 8 KHz sampling rate) with speech training, but with certain unhealthy signs showing up after only about 25 seconds. These signs are in the form of improper excursions of the elements of the vector $\underline{P}(n)$, first column of P(n) (inverse of the matrix R(n)). The fact that it takes over 2 minutes from the first appearance of unhealthy signs to divergence, in which period the excursions of the $\underline{P}(n)$ elements become worse and worse, shows that the coefficient updating algorithm is quite tolerant of certain errors in P(n). Once simulated random quantization noises, which are uniformly distributed between −0.5 bit and +0.5 bit of a 16-bit implementation, are injected into the matrix inversion lemma calculation, the prior art FAP system diverges in 0.6 second.

For comparison, within the time period of our longest test case (7'40"), the portions that estimate $\underline{P}(n)$, i.e., Eqs. 15–17 of the steepest descent scheme of the invention with the same parameters (L=1024 and N=5), always remain stable. Furthermore, the elements in the vector $\underline{P}(n)$ progress as expected, without any visible unhealthy signs like improper excursions during the entire 7'40" period. The output e(n) in the steepest descent embodiment converges approximately at the same speed as the bench mark prior art FAP and reaches the same steady state echo cancellation depth as the prior art FAP and NLMS. The SFAP according to the first embodiment of the invention ourperformes NLMS filter; with speech training, it converges in about 1 second while it takes the NLMS filter about 7 to 8 seconds to do so.

Filters of another length L=512 have also been built for SFAP, the prior art FAP and NLMS. As expected, they converge approximately twice as fast as they do for L=1024.

Thus, the adaptive filter and method using a steepest descent calculator for determining the inverse matrix coefficients, providing a stability of adaptive filtering, are provided.

Figure 4:
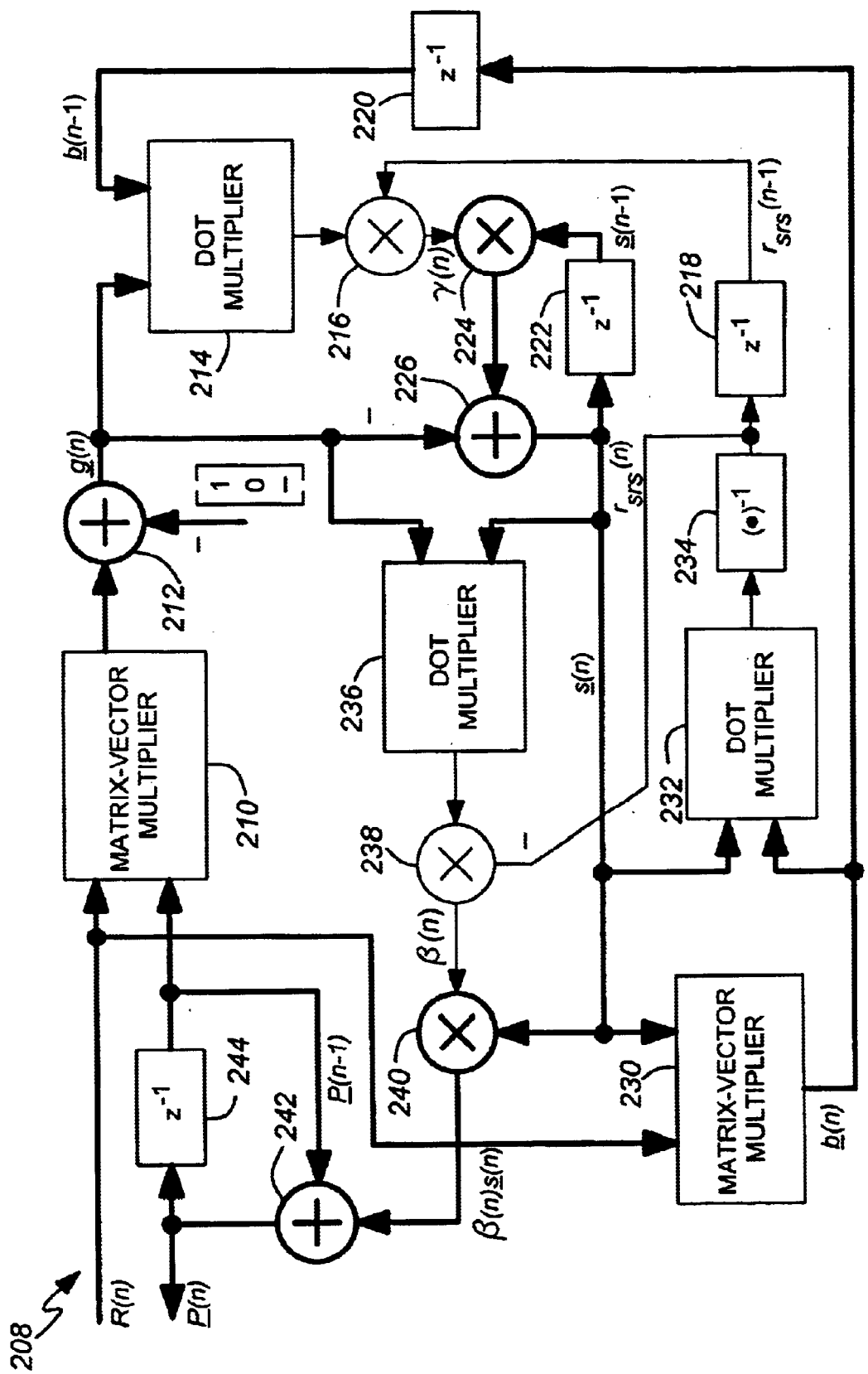
FIG. 4 is a block diagram of a conjugate gradient calculator embedded in an adaptive filter according to a second embodiment of the invention.

A method of adaptive filtering according to a second embodiment of the present invention uses an iterative "conjugate gradient" technique to iteratively solve the Equation 10, the corresponding calculator being shown in FIG. 4.

Conjugate gradient is a technique that also seeks the minimum point of a certain quadratic function iteratively. Conjugate gradient is closely related to the steepest descent scheme discussed above. It differs from the steepest decent in that it is guaranteed to reach the minimum in no more than N steps, with N being the order of the system. That is, conjugate gradient converges faster than the steepest descent. At each iteration (the same as sampling interval in out application), the conjugate gradient takes five steps consecutively:

1. to find the gradient of the quadratic function at the current point;
2. to find the optimum factor for adjusting the direction vector, along which adjustment to the parameter vector will be made;
3. to update the direction vector as determined above;
4. to find the optimum step size for the parameter vector updating; and
5. to update the parameter vector as determined above.

Unlike the steepest descent algorithm, which simply takes the negative gradient of the quadratic function as the parameter vector updating direction, conjugate gradient modifies the negative gradient to determine an optimized direction. By iteratively doing the above, the scheme reaches the unique minimum of the quadratic function, where the gradient is zero, in no more than N steps. The conjugate gradient technique also continuously tracks the minimum if it moves, such as the case with non-stationary input signal x(n). Details about the conjugate gradient algorithm can be found, for example, in a book by David G. Luenberger (Stanford University), Linear and Non-linear Programming, Addison-Wesley Publishing Company, 1984.

For an adaptive filtering application, the implied quadratic function is still shown in Equation 11, whose gradient with respect to $\underline{P}(n)$ is also Equation 12. Note that $R(n)$ must be symmetric and positive definite in order for the conjugate gradient technique to apply, this happens to be our case. Seeking the minimum, where the gradient vanishes, is equivalent to solving equation 10. The conjugate gradient is also able to track the minimum point if it moves, such as the case with non-stationary input signal $\underline{X}(n)$.

Based on the above discussion, the SFAP method according to the second embodiment, which uses the conjugate gradient technique, includes the following steps:

Initialization:

$$\underline{W}(0) = \underline{0},\ \underline{X}(0) = \underline{0},\ \eta(0) = \underline{0}, \quad \text{(Equation 24)}$$

$$R(0) = \delta I,\ \alpha = 1,\ \underline{P}(0) = \begin{bmatrix} 1/\delta \\ \underline{0} \end{bmatrix}$$

$$\underline{s}(0) = \underline{0},\ r_{srs}(0) = 0,\ \underline{b}(0) = \underline{0}$$

Updating the adaptive filter coefficients in sampling interval n including:

recursive determining of an auto-correlation matrix:

$$R(n)=R(n-1)+\underline{\xi}(n)\underline{\xi}^T(n)-\underline{\xi}(n-L)\underline{\xi}^T(n-L) \quad \text{(Equation 25)}$$

determining projection coefficients by solving the system of linear equations 10 using the conjugate technique, the projection coefficients being first column coefficients of the inverse of the auto-correlation matrix:

$$\underline{g}(n) = R(n)\underline{P}(n-1) - \begin{bmatrix} 1 \\ \underline{0} \end{bmatrix} \quad \text{(Equation 26)}$$

$$\gamma(n) = r_{srs}(n-1)\underline{g}^T(n)\underline{b}(n-1) \quad \text{(Equation 27)}$$

$$\underline{s}(n) = \gamma(n)\underline{s}(n-1) - \underline{g}(n) \quad \text{(Equation 28)}$$

$$\underline{b}(n) = R(n)\underline{s}(n) \quad \text{(Equation 29)}$$

$$r_{srs}(n) = \frac{1}{\underline{s}^T(n)\underline{b}(n)} \quad \text{(Equation 30)}$$

$$\beta(n) = -r_{srs}(n)\underline{g}^T(n)\underline{s}(n) \quad \text{(Equation 31)}$$

$$\underline{P}(n) = \underline{P}(n-1) + \beta(n)\underline{s}(n) \quad \text{(Equation 32)}$$

and performing an adaptive filtering for updating the filter coefficients $$\underline{W}(n) = \underline{W}(n-1) + \alpha\eta_{N-1}(n-1)\underline{X}(n-N) \quad \text{(Equation 33)}$$

$$y(n) = \underline{W}^T(n)\underline{X}(n) + \alpha\underline{\eta}^{-T}(n-1)\underline{\tilde{R}}(n) \quad \text{(Equation 34)}$$

$$e(n) = d(n) - y(n) \quad \text{(Equation 35)}$$

$$\underline{\varepsilon}(n) = e(n)\underline{P}(n) \quad \text{(Equation 36)}$$

$$\underline{\eta}(n) = \begin{bmatrix} 0 \\ \overline{\eta}(n-1) \end{bmatrix} + \underline{\varepsilon}(n) \quad \text{(Equation 37)}$$

where $\underline{\xi}(n)$ is defined above in Eq. 23, and $\underline{R}(n)$ is the first column of $R(n)$, $\underline{\tilde{R}}(n)$ is an N-1 vector that consists of the N-1 lower most elements of the N vector $\underline{R}(n)$, and $\overline{\eta}(n)$ is an N-1 vector that consists of the N-1 upper most elements of the N vector $\underline{\eta}(n)$.

The five expressions shown in Eq. 26, 27, 28, 31 and 32 respectively correspond to the five steps of the conjugate gradient technique discussed earlier in this section. $\underline{g}(n)$ is the gradient of the implied quadratic function, $\gamma(n)$ is the optimum factor for updating the direction vector $\underline{s}(n)$. $\beta(n)$ is the optimum step size for parameter vector adjustment which is made in Eq. 32.

As shown in Table 2, the total computational requirement of the Stable FAP method according to the second embodiment of the invention is $2L+2N^2+9N+1$ MACs and 1 division. It should be also ensured that the conjugate gradient converges fast enough so that the adaptive filter coefficients converge.

An adaptive filter according to the second embodiment of the invention is similar to that of the first embodiment shown in FIG. 2 except for the calculator 108 now operating in accordance with the conjugate gradient technique and being designated by numeral 208 in FIG. 4.

The conjugate gradient calculator 208 embedded in the adaptive filter of the second embodiment is shown in detail in FIG. 4. Thick lines represent the propagation of a matrix or vector signal, i.e., with more than one component, and the use of a thin line stands for a scalar signal propagation. In the calculator 208, the auto-correlation matrix R(n) and the vector $\underline{P}(n-1)$, part of the estimated inverse of R(n-1), are multiplied in a Matrix-vector Multiplier 210. The resulted vector product is subtracted by a constant vector $[1\ 0\ \ldots\ 0]^T$ in a Summer 212 to produce the gradient vector $\underline{g}(n)$, which contains the feedback error information about using $\underline{P}(n-1)$ as the estimated inverse of R(n). The Matrix-vector Multiplier 210 and the Summer 212 implement the Eq. 26 above.

TABLE 2

| Equation | Multiply and accumulate operations | Division |
| --- | --- | --- |
| 25 | 2N | |
| 26 | $N^2$ | |
| 27 | N + 1 | |
| 28 | N | |
| 29 | $N^2$ | |
| 30 | N | 1 |
| 31 | N + 1 | |
| 32 | N | |
| 33 | L | |
| 34 | L + N − 1 | |
| 35 | | |
| 36 | N | |
| 37 | | |
| Total | $2L + 2N^2 + 9N + 1$ | 1 |

The gradient $\underline{g}(n)$ is further dot-multiplied with $\underline{b}(n-1)$, an auxiliary vector found in the last sampling interval, in a Dot Multiplier 214. The resulted scalar product is multiplied by $r_{srs}(n-1)$ in a Multiplier 216, to produce $\gamma(n)$, a factor to be used in adjusting $\underline{s}(n-1)$, the direction vector for adjusting $\underline{P}(n-1)$. $r_{srs}(n-1)$ is obtained from $r_{srs}(n)$ by putting the latter through a unit delay element 218, providing a delay of one sampling interval. Similarly, $\underline{b}(n-1)$ is obtained from $\underline{b}(n)$ by using another unit delay element 220. The part of the diagram described in this paragraph implements Eq. 27 shown above. With $\gamma(n)$, $\underline{g}(n)$, and $\underline{s}(n-1)$ available, $\underline{s}(n-1)$ is then updated into $\underline{s}(n)$ by using yet another unit delay element 222, with a delay of one sampling interval, scalar-vector Multiplier 224 and Vector Summer 226 which implement operations shown in eq. 28 above. Next, the auxiliary vector $\underline{b}(n)$, to be used in the next sampling interval, is calculated as the product between R(n) and $\underline{s}(n)$ in another Matrix-vector Multiplier 230. This implements Eq. 29 above. This b(n) is then dot-multiplied with s(n) in yet another Dot multiplier 232, and the scalar product is reciprocated in a Reciprocator 234, to produce $r_{srs}(n)$ (Eq. 30). This is where the only division operation is. By using yet another Dot Multiplier 236 and a Multiplier 238, g(n) and s(n) are dot-multiplied, and the result, being a scalar product, is multiplied with $-r_{srs}(n)$ to derive β(n), thus implementing Eq. 31 above. Once β(n) is available, it is multiplied with s(n) in another scalar-vector Multiplier 240 to form the correction term to P(n−1), which is then added to P(n−1) in a Vector Summer 242 in order to derive P(n) (Eq. 32 above).

The rest of the structure of the adaptive filter, employing the conjugate gradient calculator 208, is similar to that shown in FIG. 2 and described above.

A C language prototype for 16-bit fixed-point DSP implementation of the SFAP using the conjugate gradient scheme has been built and studied. It has the same parameters (L=1024 and N=5) and uses same data files as the steepest descent prototype described above. It behaves very similarly to its floating-point steepest descent counterpart. There is no observable difference in the way P(n) elements progress, and they also remain stable during the 7'40" longest testcase period. The output e(n) in the conjugate gradient embodiment converges approximately at the same speed as the bench mark prior art FAP and reaches the same steady state echo cancellation depth as the bench mark prior art FAP and NLMS. The SFAP according to the second embodiment of the invention also ourperformes NLMS filter in terms of convergence speed. A conjugate gradient filter of another length L=512 have been also built. As expected, it converges twice as fast as it does for L=1024.

Thus, an adaptive filter and a method providing a stability of adaptive filtering based on feedback adjustment, are provided.

Although the methods operate with real-valued numbers, it does not prevent the invention from being extended to cases where introduction of complex numbers is necessary.

Although the embodiments are illustrated within the context of echo cancellation, the results are also applicable to other adaptive filtering applications.

Thus, it will be appreciated that, while specific embodiments of the invention are described in detail above, numerous variations, modifications and combinations of these embodiments fall within the scope of the invention as defined in the following claims.

What is claimed is:

1. A method of adaptive filtering using a Fast Affine Projection (FAP) adaptive filter, comprising the steps of:
   (a) determining adaptive filter coefficients;
   (b) updating the adaptive filter coefficients, setting a normalized step size close to unity, the updating step comprising,:
      determining autocorrelation matrix coefficients from a reference input signal,
      determining projection coefficients of the inverse autocorrelation matrix, by solving a system of linear equations of the autocorrelation matrix using a descending iterative method, having an inherent stability of operation, the projection coefficients being used for updating the adaptive filter coefficients;
   (c) repeating the step (b) the required number of times.

2. A method as defined in claim 1 wherein determining the auto-correlation matrix coefficients is performed recursively.

3. A method as defined in claim 1 wherein the normalized step size is less than unity.

4. A method as defined in claim 1 wherein the normalized step size equals unity.

5. A method as defined in claim 1 wherein the normalized step size is from about 0.9 to 1.0.

6. A method as defined in claim 1 wherein the normalized step size is from about 0.7 to 1.0.

7. A method as defined in claim 1 wherein the descending iterative method is a steepest descent method.

8. A method as defined in claim 1 wherein the descending iterative method is a conjugate gradient method.

9. A method as defined in claim 1 wherein the descending iterative method is a Newton's method.

10. A method as defined in claim 1 wherein the descending iterative method is a PARTAN method.

11. A method as defined in claim 1 wherein the descending iterative method is a quasi-Newton's method.

12. A method as defined in claim 1 wherein the steps are performed with real value numbers.

13. A method as defined in claim 1 wherein the steps are performed with complex value numbers.

14. A method as defined in claim 1, the method being used for echo cancellation.

15. A method as defined in claim 1, the method being used for noise cancellation.

16. A method as defined in claim 1, the method being used for channel equalization.

17. A method as defined in claim 1, the method being used for system identification.

18. An adaptive filter comprising:
   a Fast Affine Projection (FAP) adaptive filter characterized by adaptive filter coefficients:
      a means for updating the adaptive filter coefficients, the means being set with a normalized step size close to unity and comprising:
      a correlator for determining auto-correlation matrix coefficients from a reference input signal, the inverse auto-correlation matrix coefficients being projection coefficients;
      a calculator for determining projection coefficients of the inverse autocorrelation matrix, by solving a system of linear equations of the autocorrelation matrix using a descending iterative method having an inherent stability of operation, the projection coefficients being used for updating the adaptive filter coefficients.

19. An adaptive filter as defined in claim 18 wherein the correlator is a recursive correlator.

20. An adaptive filter as defined in claim 18 wherein the calculator is a steepest descent calculator.

21. An adaptive filter as defined in claim 18 wherein the calculator is a conjugate gradient calculator.

22. An adaptive filter as defined in claim 18 wherein the calculator is a calculator performing calculation according to a Newton's method.

23. An adaptive filter as defined in claim 18 wherein the calculator is a PARTAN calculator.

24. An adaptive filter as defined in claim 18 wherein the calculator is a calculator performing calculations according to a quasi-Newton's method.

25. An adaptive filter as defined in claim 18 capable of operating with real numbers.

26. An adaptive filter as defined in claim 18 capable of operating with complex numbers.

27. An adaptive filter as defined in claim 18 for use in echo cancellation.

28. An adaptive filter as defined in claim 18 for use in noise cancellation.

29. An adaptive filter as defined in claim 18 for use in channel equalization.

30. An adaptive filter as defined in claim 18 for use in system identification.

31. A method of adaptive filtering using a Fast Affine Projection (FAP) adaptive filter, comprising the steps of:

(a) determining adaptive filter coefficients;

(b) updating the adaptive filter coefficients, setting a normalized step size close to unity, the updating step comprising:

recursively determining auto-correlation matrix coefficients from a reference input signal;

determining a first column of projection coefficients of the inverse auto-correlation matrix, by solving a system of linear equations of the auto-correlation matrix using a descending iterative method having an inherent stability of operation, the projection coefficients being used for updating the adaptive filter coefficients;

(c) repeating step (b) the required number of times.

32. A method as defined in claim 31 wherein the descending iterative method is selected from the group consisting of steepest descent method, conjugate gradient method, Newton's method, PARTAN method and quasi-Newton's method.

33. A method as defined in claim 31, the method being used in an application selected from the group consisting of echo cancellation, noise cancellation, channel equalization and system identification.

34. An adaptive filter comprising:

a Fast Affine Projection (FAP) adaptive filter characterized by adaptive filter coefficients:

a means for updating the filter coefficients, the means being set with a normalized step size close to it a maximal value and comprising:

a correlator for recursively determining autocorrelation matrix coefficients from a reference input signal, a calculator for determining a first column of projection coefficients, of the inverse autocorrelation matrix by solving from a system of linear equations of the autocorrelation matrix using a descending iterative method having an inherent stability of operation, the projection coefficients being used for updating the adaptive filter coefficients.

35. A filter as defined in claim 31 wherein the calculator is selected from the group consisting of steepest descent calculator, conjugate gradient calculator, Newton's calculator, PARTAN calculator and quasi-Newton's calculator.

36. A filter as defined in claim 31 for use in an application selected from the group consisting of echo cancellation, noise cancellation, channel equalization and system identification.

* * * * *